(12) United States Patent
Hopper et al.

(10) Patent No.: US 6,855,968 B1
(45) Date of Patent: Feb. 15, 2005

(54) HIGH-SPEED PHOTON DETECTOR AND NO COST METHOD OF FORMING THE DETECTOR

(75) Inventors: Peter J. Hopper, San Jose, CA (US); Philipp Lindorfer, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 34 days.

(21) Appl. No.: 10/356,423

(22) Filed: Jan. 30, 2003

(51) Int. Cl.⁷ .......................................... H01L 27/148
(52) U.S. Cl. ................. 257/225; 257/226; 257/228; 257/233; 257/234
(58) Field of Search ................................ 257/225–234

(56) References Cited

PUBLICATIONS

Eddy Currents. [online]. [Retrieved on Dec. 1, 2002]. Retrieved from the Internet: <URL: www.ac.wwu.edu/vawter/PhysicsNet/Tropics/Inductance/EddyCurrents.html>, pp. 1–2.
What is Eddy Current Testing?—B.P.C. Rao [online]. [Retrieved on Dec. 1, 2002]. Retrieved from the Internet: <URL: www.geocities.com/raobpc/ED-Def>, pp. 1–6.

*Primary Examiner*—Fetsum Abraham
(74) *Attorney, Agent, or Firm*—Mark C. Pickering

(57) ABSTRACT

A photon detector capable of detecting gigahertz frequency optical signals utilizes a layer of photonic material that is formed below of the coil of an inductor. When a pulsed light source is applied to the layer of photonic material, the photonic material generates eddy currents that alter the magnetic flux of the inductor. The signals can then be detected by detecting the change in magnetic flux of the inductor.

16 Claims, 4 Drawing Sheets

HIGH-SPEED PHOTON DETECTOR AND NO COST METHOD OF FORMING THE DETECTOR

RELATED APPLICATION

The present application is related to application Ser. No. 10/355,904 for "High Speed Photon Detector and Method of Forming the Detector" filed by Peter Hopper et al. on an even date herewith.

DETAILED DESCRIPTION OF THE INVENTION

Figure 1A:
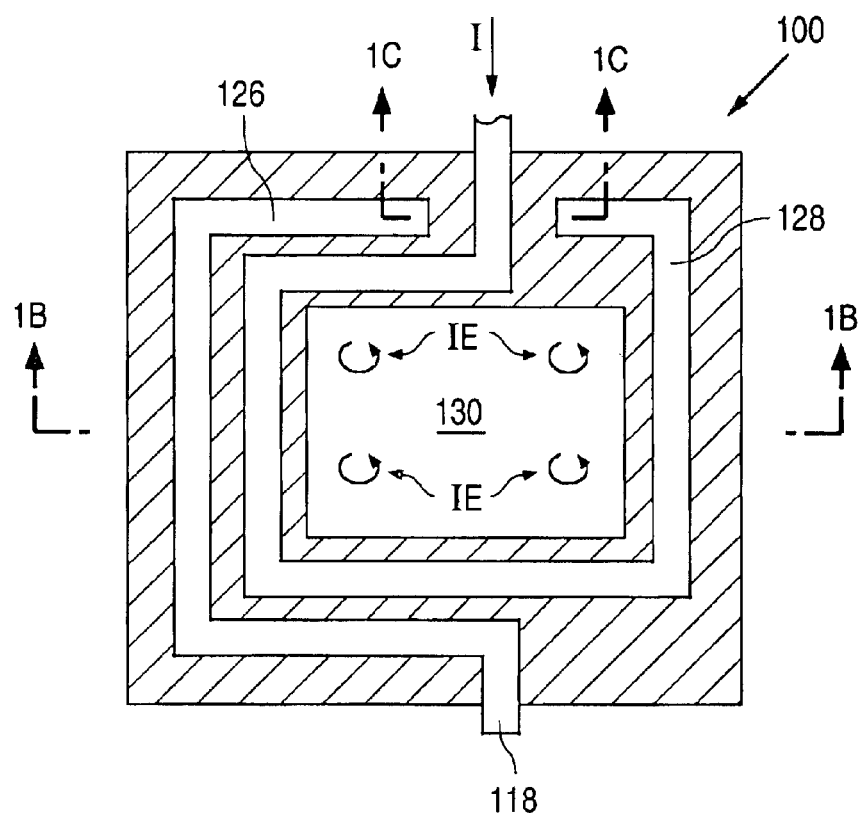
FIGS. 1A–1C are views illustrating an example of a high-speed photon detector 100 in accordance with the present invention.
Figure 1B:
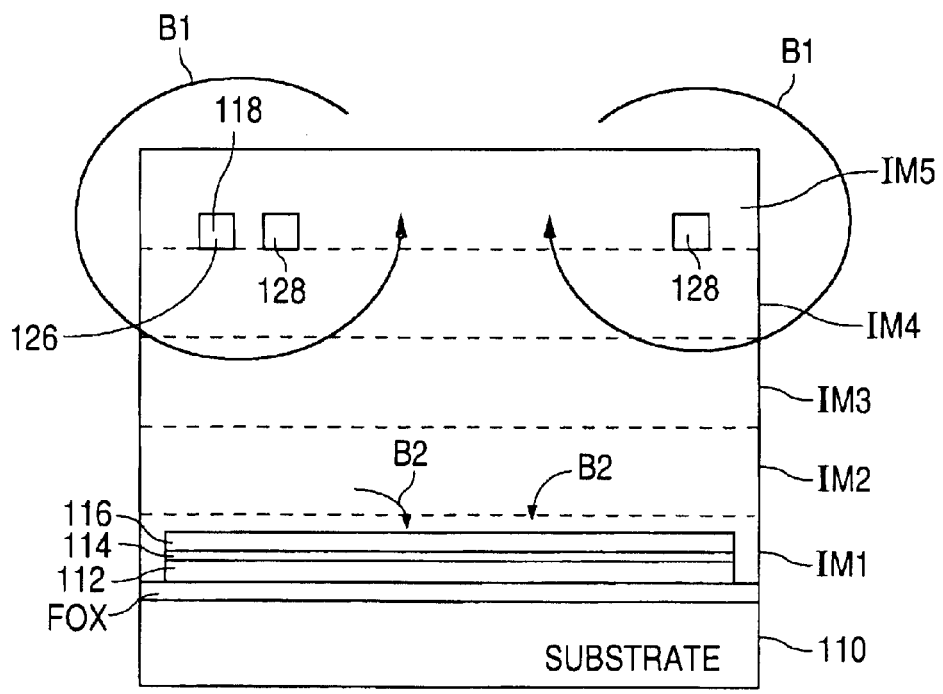
Figure 1C:
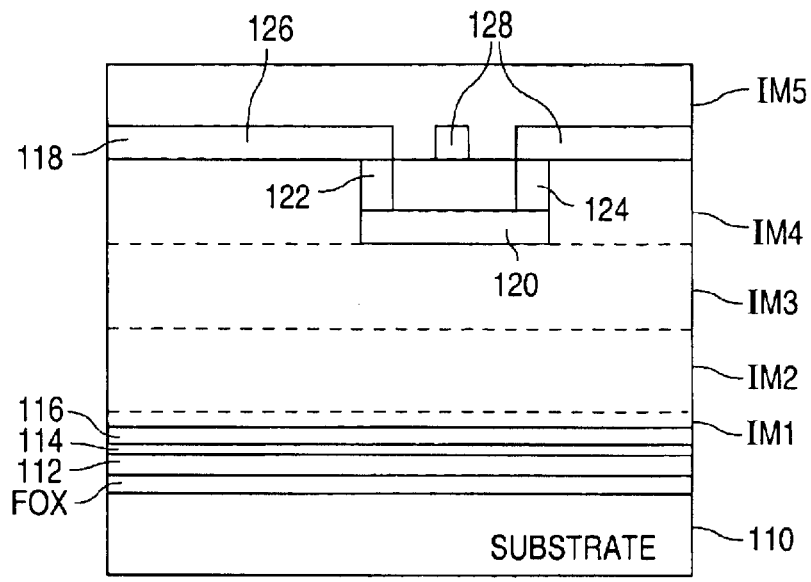

FIGS. 1A–1C show views that illustrate an example of a high-speed photon detector 100 in accordance with the present invention. FIG. 1A shows a plan view, while FIGS. 1B and 1C show cross-sectional views taken along lines 1B—1B and 1C—1C, respectively, of FIG. 1A.

As shown in FIGS. 1B and 1C, detector 100, which is formed on a region of semiconductor material 110, such as a p-type or n-type substrate or well, includes a field oxide region FOX that is formed on material 110, and a first layer of polysilicon (poly-1) 112 that is formed on field oxide region FOX.

In addition, detector 100 also includes a layer of interpoly dielectric 114 that is formed on poly-1 layer 112, and a second layer of polysilicon (poly-2) 116 that is formed on dielectric layer 114. Poly-1 and poly-2 layers 112 and 116 generate a large number of charge carriers when light strikes layers 112 and 116, and have a high recombination rate so that the carriers recombine quickly when light no longer strikes layers 112 and 116.

Poly-1 and poly-2 layers 112 and 116 also generate significantly more electron-hole pairs than the surrounding layers of isolation material IM when struck by light, and have a higher recombination rate than material 110 when no longer struck by light. Further, the combined thickness of poly-1 and poly-2 layers 112 and 116 is ideally thick enough to capture all of the photons of a wavelength of light, or within a band of light, that strikes layers 112 and 116.

However, as described in greater detail below, the combined thickness of poly-1 and poly-2 layers 112 and 116 need not capture all of the photons. Poly-1 and poly-2 layers 112 and 116 can be utilized with optical frequencies, such as blue, and infra-red (IR) signals when the power is high.

Detector 100 additionally includes a number of layers of isolation material IM that are formed on field oxide region FOX and poly-2 layer 116. In the example shown in FIGS. 1A–1C, detector 100 includes five layers of isolation material IM1–IM5 which, in turn, support a four metal layer process.

Further, detector 100 also includes a planar (watch spring) inductor 118 that is formed in and on isolation layers IM3–IM5. (Other inductor structures can alternately be used.) Inductor 118 includes a lower metal trace 120 that is formed on isolation layer IM3, and a pair of vias 122 and 124 that are formed through isolation layer IM4 to make an electrical connection with the opposite ends of lower metal trace 120.

In addition, inductor 118 includes a first upper metal trace 126 that is formed on the top surface of isolation layer IM4 to make an electrical connection with via 122, and a second upper metal trace 128 that is formed on the top surface of isolation layer IM4 to make an electrical connection with via 124.

Lower metal trace 120 can be formed from any metal trace, while upper metal traces 126 and 128 can be formed from any overlying metal trace. In the FIG. 1 example, lower metal trace 120 is formed from a third layer of metal (metal-3), while upper metal traces 126 and 128 are formed from a fourth layer of metal (metal-4).

In operation, a periodic AC voltage waveform is placed on planar inductor 118 so that a current I flows through inductor 118. As shown in FIG. 1B, the periodic AC voltage creates a pulsating magnetic field B1 that is normal to the plane of inductor 118 (vertical and oriented out of the page in FIG. 1A). (Although shown locally, magnetic field B1 extends outward through poly layers 112 and 116.)

The pulsating magnetic field B1 creates a pulsating magnetic flux that induces pulsating eddy currents IE in poly-1 and poly-2 layers 112 and 116. As shown in FIG. 1A, the eddy currents IE are small loops of current that exist only in layers 112 and 116. The eddy currents IE are normal to the magnetic field B1, and are parallel with the plane of inductor 118.

The pulsating eddy currents IE also create a pulsating magnetic field B2 that is normal to the plane of poly layers 112 and 116 (vertical and oriented into the top surface of layer 116). The pulsating magnetic field B2 creates a pulsating magnetic flux that opposes the magnetic flux generated by magnetic field B1. The magnetic field B2 generated by the eddy currents is smaller than the magnetic field B1 generated by the AC voltage waveform. As a result, the eddy currents reduce the magnetic flux generated by the AC voltage waveform.

In the present invention, the impedance of inductor 118, which is a function of the magnetic flux, is continually measured or sampled using conventional circuitry. When no light is incident on poly layers 112 and 116, the impedance of inductor 118 has a first value that is defined by the physical characteristics of layers 112 and 116 and inductor 118.

On the other hand, when light is incident on poly layers 112 and 116, the light striking layers 112 and 116 generates a large number of electron-hole pairs. The free electrons increase the magnitudes of the periodic eddy currents IE which, in turn, increases the magnitude of the pulsating magnetic field B2.

The increased magnitude of the pulsating magnetic field B2 reduces the net pulsating magnetic flux which, in turn, changes the impedance of inductor 118. Thus, by detecting the change in the impedance of inductor 118, the presence or absence of light incident on poly layers 112 and 116 can be detected. (Other changing characteristics besides the impedance of inductor 118 that are a function of the magnetic field or flux can alternately be used to detect the presence or absence of light incident on poly layers 112 and 116.)

As noted above, one of the characteristics of poly layers 112 and 116 is that layers 112 and 116 have a fairly high recombination rate. As a result, when the light is pulsed off, the charge carriers recombine quickly which, in turn, causes the impedance of inductor 118 to change quickly.

On the other hand, pure silicon, such as a substrate or well material, has a lower recombination rate which, in turn, means that photo-generated charge carriers can be present well after the light has been pulsed off. Thus, when the combined thickness of poly-1 and poly-2 layers 112 and 116 is not thick enough to capture all of the photons of a wavelength of light, or within a band of light, that strikes layers 112 and 116, the photons passing through poly layers 112 and 116 form photo-generated charge carriers in material 110 that have a longer lifetime.

The longer-lifetime photo-generated charge carriers in material 110 continue to effect the magnetic flux and, therefore, the impedance of inductor 118, after the light has been pulsed off. Thus, if sufficient numbers of photons pass through layers 112 and 116, false readings can result.

One of the advantages of the present invention is that pulsed gigahertz frequency optical signals can be detected. One of the limitations of conventional photodiodes is that the transit time of the charge carriers is typically too long for pulsed gigahertz frequency optical signals.

With conventional photodiodes, photons generate electron-hole pairs. The electrons are then typically collected at a sense point. Thus, if a pulsed light source is applied to a photodiode, the photodiode must be able to generate and collect the electrons from one light pulse before the next light pulse begins.

In the present invention, the photo-generated charge carriers do not need to be collected by a sense point. In less time than it takes for the charge carriers to be collected by the sense point of a photodiode, the charge carriers in poly layers 112 and 116 change the magnetic flux which, in turn, changes the impedance of inductor 118. Thus, by continually monitoring or sampling the impedance of inductor 118, gigahertz frequency optical signals can be detected.

Another of the advantages of the present invention is that detector 100 can be formed in a standard silicon-based semiconductor process for no additional cost. FIGS. 2A–2F show views that illustrate an example of a method of forming a photon detector in accordance with the present invention.

Figure 2A:
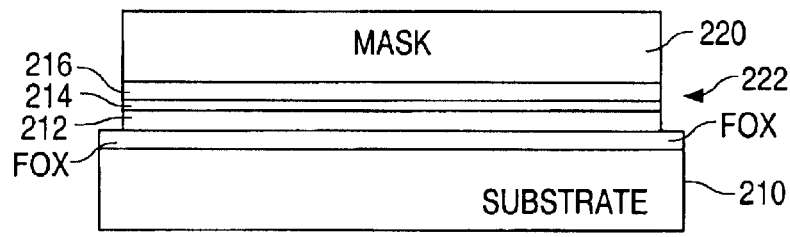
FIGS. 2A–2F are views illustrating an example of a method of forming a photon detector in accordance with the present invention.

As shown in FIG. 2A, the method begins by forming a region of field oxide FOX on a semiconductor material 210, such as an n-type or p-type substrate or well. Following this, a first layer of polysilicon (poly-1) 212 is formed. Poly-1 layer 212 is formed at the same time that the lower electrodes of the capacitors of a double poly process are formed and doped.

Next, a layer of interpoly dielectric 214 is formed on poly-1 layer 212. Layer 214 is formed at the same time that the interpoly dielectric layer of the capacitors are formed. After layer 214 has been formed, a second layer of polysilicon (poly-2) 216 is formed on dielectric layer 214. Poly-2 layer 216 is formed at the same time that the upper electrodes of the capacitors of a double poly process are formed and doped.

Following this, a mask 220 is formed and patterned on poly-2 layer 216. The exposed areas of poly-2 layer 216, and the underlying regions of dielectric layer 214 and poly-1 layer 212 are then removed. The etch forms a photonic region 222. After the etch, mask 220 is removed.

Figure 2B:
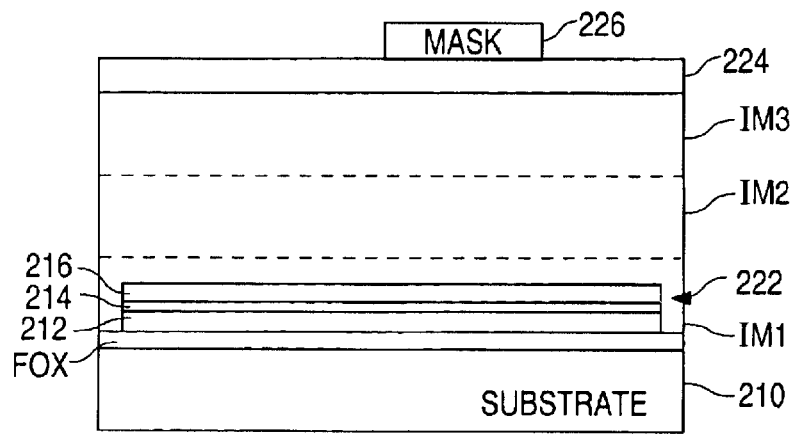

Next, as shown in FIG. 2B, a first layer of isolation material IM1 is formed on photonic region 222. Following this, a first layer of metal (not shown) is formed on isolation layer IM1, and then patterned to form metal-1 traces. In this example, none of the metal-1 traces pass over the region overlying photonic region 222. After the metal-1 traces have been formed, a second layer of isolation material IM2 is formed on isolation layer IM1 and the metal-1 traces.

Following this, a second layer of metal (not shown) is formed on isolation layer IM2, and then patterned to form metal-2 traces. In this example, none of the metal-2 traces pass over the region overlying photonic region 222. After the metal-2 traces have been formed, a third layer of isolation material IM3 is formed on isolation layer IM2 and the metal-2 traces. Once isolation layer IM3 has been formed, a third layer of metal 224 is formed on isolation layer IM2. Next, a mask 226 is formed and patterned.

Figure 2C:
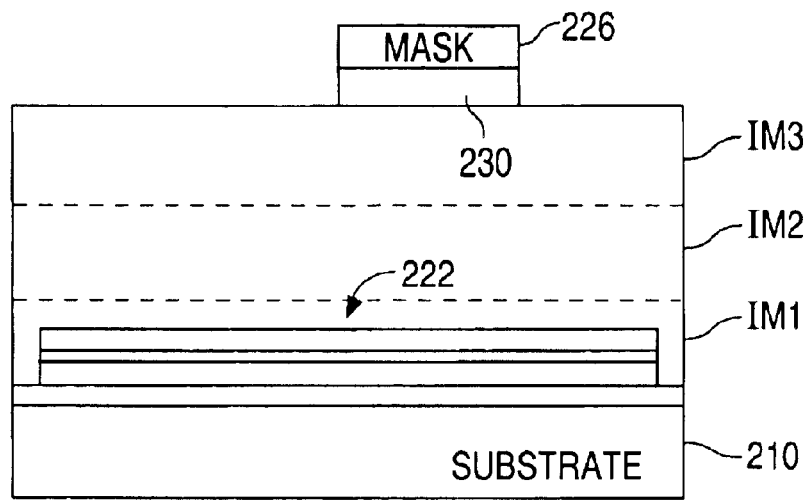
Figure 2D:
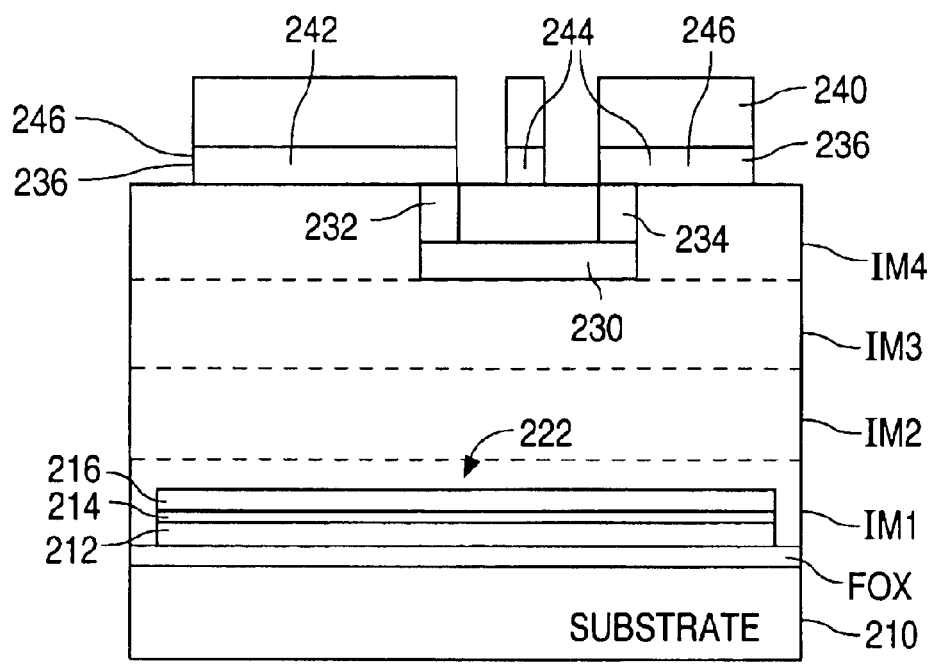

Following this, as shown in FIG. 2C, the exposed regions of third metal layer 224 are removed to form metal-3 traces, including a lower trace 230. Mask 226 is then removed. As shown in FIG. 2D, after the metal-3 traces have been formed, a fourth layer of isolation material IM4 is formed on isolation layer IM3 and lower trace 230.

Once isolation layer IM4 has been formed, vias 232 and 234 are formed through isolation layer IM4 to make an electrical connection with opposite ends of lower trace 230 using conventional steps. After this, a fourth layer of metal 236 is formed on isolation layer IM4 to make an electrical connection with vias 232 and 234. Next, a mask 240 is formed and patterned.

Figure 2E:
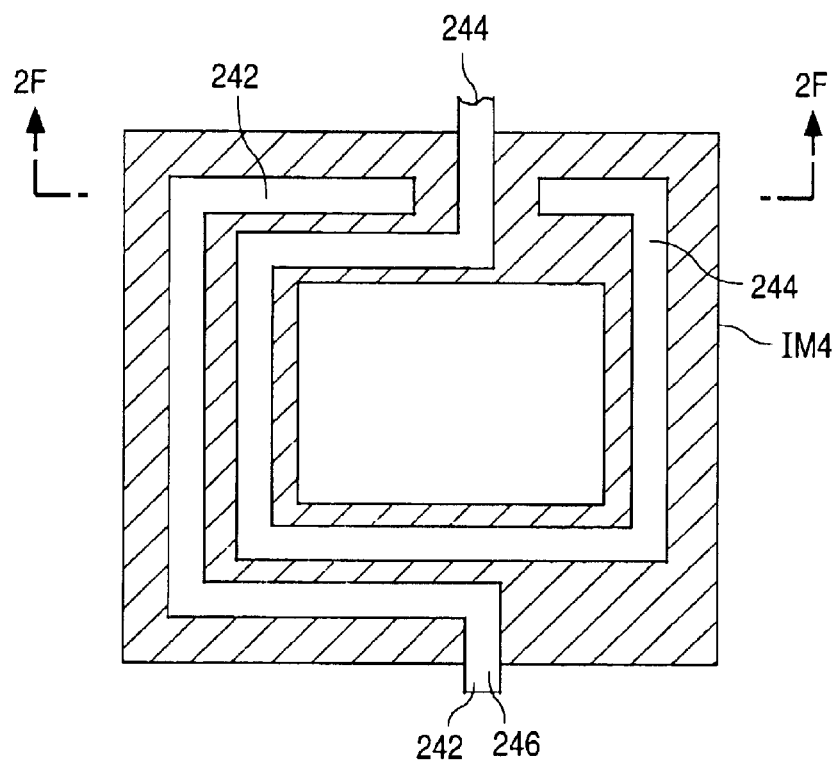

Following this, as shown in FIG. 2D, the exposed regions of fourth metal layer 236 are removed to form metal-4 traces, including a first upper trace 242 and a second upper trace 244. Mask 240 is then removed. FIG. 2E shows a plan view that illustrates the detector following the etch of the fourth metal layer to form traces 242 and 244. As shown in FIG. 2E, the etch forms an inductor 246.

Figure 2F:
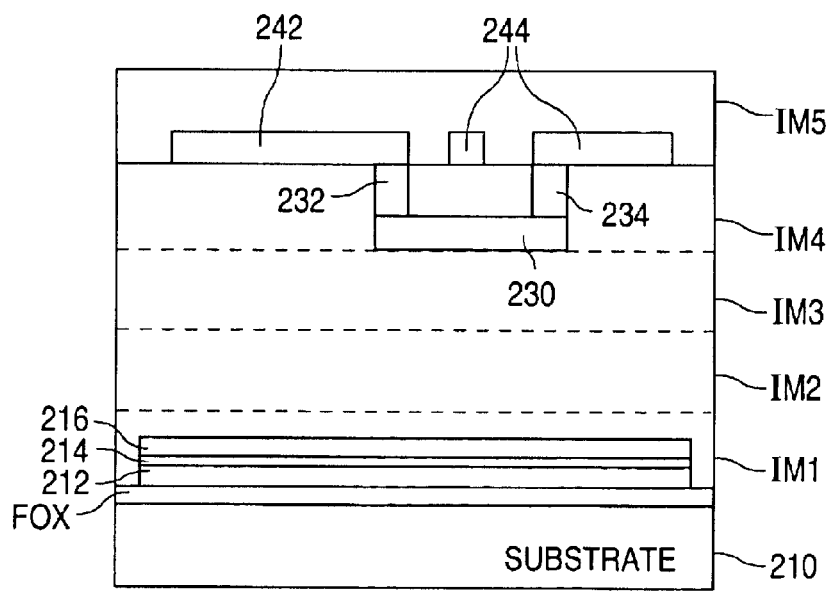

Next, as shown in FIG. 2F, which is a cross-sectional view taken along line 2F—2F of FIG. 2E, a fifth layer of isolation material IM5 is formed on isolation layer IM4 and traces 242 and 244. Following this, the method continues with conventional steps. The above-described steps can be formed by modifying existing masks, and do not require any additional masking steps. As a result, the detector can be formed for no additional cost.

Thus, an inductance-based, high-speed photon detector that can detect gigahertz frequency optical signals, and a method of forming the detector have been described. It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A photon detector formed on a semiconductor material that has a conductivity type, the photon detector comprising:
   a layer of insulation material formed on the semiconductor material;
   a layer of photonic material formed on the layer of insulation material;
   a plurality of layers of isolation material that are formed on the layer of insulation material over the layer of photonic material; and
   an inductor that is formed in the plurality of isolation layers, the layer of photonic material generating more electron-hole pairs than the surrounding layers of isolation material when struck by light.

2. The photon detector of claim 1 wherein:
   the inductor has a coil; and
   the layer of photonic material is located below the coil.

3. The photon detector of claim 2 wherein the inductor includes a first metal trace that is formed on one layer of isolation material of the plurality of layers of isolation material.

4. The photon detector of claim 3 wherein the inductor includes:
   first and second vias formed through another layer of isolation material to make an electrical connection with opposite ends of the first metal trace;
   a second metal trace formed on said another layer of isolation material to make an electrical connection with the first via; and
   a third metal trace formed on said another layer of isolation material to make an electrical connection with the second via.

5. The photon detector of claim 1 wherein the layer of photonic material includes polysilicon.

6. The photon detector of claim 1 wherein the layer of photonic material includes a plurality of isolated layers of polysilicon.

7. The photon detector of claim 1 wherein the layer of photonic material is located vertically between the inductor and a top surface of the semiconductor material.

8. A method of detecting light received by a detector, the detector having:
   a layer of photonic material formed over a region of semiconductor material;
   a plurality of layers of isolation material that are formed over the layer of photonic material; and
   an inductor that is formed in the plurality of isolation layers,
   the method comprising the steps of:
   measuring a first impedance of the inductor when no light strikes the layer of photonic material;
   measuring a second impedance of the inductor when light strikes the layer of photonic material; and
   detecting an optical signal by detecting changes in the impedance of the inductor.

9. The method of claim 8 wherein:
   the inductor has a coil; and
   the layer of photonic material is located below the coil.

10. The method of claim 9 wherein the layer of photonic material includes polysilicon.

11. A method of forming an optical detector on a region of semiconductor material that has a conductivity type, the method comprising the steps of:
   forming a layer of insulation material on the semiconductor material;
   forming a layer of photonic material on the layer of insulation material;
   forming a plurality of layers of isolation material on the layer of insulation material over the layer of photonic material; and
   forming an inductor in the plurality of isolation layers, the layer of photonic material generating more electron-hole pairs than the surrounding layers of isolation material when struck by light.

12. The method of claim 11 wherein the layer of photonic material includes polysilicon.

13. The method of claim 11 wherein the step of forming a layer of photonic material includes the step of forming a layer of polysilicon.

14. The method of claim 13 wherein the layer of photonic material includes a plurality of isolated layers of polysilicon.

15. The method of claim 11 wherein the step of forming a layer of photonic material includes the step of forming a plurality of layers of isolated photonic material.

16. The method of claim 11 wherein the inductor has a loop, and the photonic material includes polysilicon that is formed below the loop.

* * * * *